(12) United States Patent  
Kim

(10) Patent No.: US 8,003,414 B2  
(45) Date of Patent: Aug. 23, 2011

(54) LIGHT EMITTING ELEMENTS AND METHODS OF FABRICATING THE SAME

(75) Inventor: Yu-Sik Kim, Suwon-si (KR)

(73) Assignee: Samsung Electronics, Co., Ltd. (KR)

( * ) Notice: Subject to any disclaimer, the term of this patent is extended or adjusted under 35 U.S.C. 154(b) by 97 days.

(21) Appl. No.: 12/459,950

(22) Filed: Jul. 10, 2009

(65) Prior Publication Data

US 2010/0015738 A1    Jan. 21, 2010

(30) Foreign Application Priority Data

Jul. 16, 2008  (KR) .................. 10-2008-0069231

(51) Int. Cl.  
*H01L 33/00* (2010.01)

(52) U.S. Cl. .................. 438/22; 257/E33.001

(58) Field of Classification Search .......... 438/22, 438/26, 28, 39, 42; 257/E33.001, E33.056  
See application file for complete search history.

(56) References Cited

U.S. PATENT DOCUMENTS

| | | | | |
|---|---|---|---|---|
| 5,207,864 A | * | 5/1993 | Bhat et al. | 438/455 |
| 5,585,648 A | * | 12/1996 | Tischler | 257/103 |
| 6,071,795 A | * | 6/2000 | Cheung et al. | 438/458 |
| 6,426,512 B1 | * | 7/2002 | Ito et al. | 257/12 |
| 7,148,520 B2 | | 12/2006 | Yoo | |
| 2003/0080344 A1 | | 5/2003 | Yoo | |
| 2006/0091420 A1 | | 5/2006 | Yoo | |
| 2006/0189020 A1 | | 8/2006 | Kim | |
| 2007/0057273 A1 | | 3/2007 | Yoo | |
| 2007/0298587 A1 | | 12/2007 | Park et al. | |
| 2008/0274574 A1 | * | 11/2008 | Yun | 438/47 |
| 2009/0087937 A1 | | 4/2009 | Kim | |

FOREIGN PATENT DOCUMENTS

| KR | 10-2005-0038581 A | 4/2005 |
|---|---|---|
| KR | 10-2006-0093528 A | 8/2006 |

* cited by examiner

*Primary Examiner* — Matthew Smith  
*Assistant Examiner* — Daniel Shook  
(74) *Attorney, Agent, or Firm* — Mills & Onello, LLP

(57) ABSTRACT

Methods of fabricating light emitting elements and light emitting devices, light emitting elements and light emitting devices are provided. In some embodiments, the methods of fabricating a light emitting element includes forming a buffer layer on at least one first substrate, bonding the at least one first substrate on a second substrate, wherein the buffer layer is placed between each of the first substrate and the second substrate and the second substrate is larger than the first substrate, exposing the buffer layer, and sequentially forming a first conductive layer, a light emitting layer, and a second conductive layer on the exposed buffer layer.

17 Claims, 16 Drawing Sheets

LIGHT EMITTING ELEMENTS AND METHODS OF FABRICATING THE SAME

CROSS REFERENCE TO RELATED APPLICATION

This application claims priority to Korean Patent Application No. 10-2008-0069231, filed on Jul. 16, 2008, in the Korean Intellectual Property Office, the disclosure of which is incorporated herein by reference in its entirety.

FIELD OF THE INVENTION

The present invention relates light emitting elements and methods of fabricating the same.

BACKGROUND

Light emitting elements, such as light emitting diodes (LEDs) and laser diodes (LDs), emit light by combining electrons and holes. Such light emitting elements have small power consumption, long life span, compactness (so they can be installed in a limited space), and strong characteristics against vibration.

In some embodiments, when fabricating certain light emitting elements, a small substrate less than 6 inches can be used since it is difficult to make a substrate used for fabricating light emitting elements larger than 6 inches. But when a small substrate is used, throughput is decreased, and as a result, it can be difficult to reduce the unit cost of the light emitting elements. Also, from the perspective of fabrication, since equipment is typically selected according to the size of the substrate, equipment suitable for a substrate less than 6 inches is typically used when fabricating light emitting elements.

SUMMARY OF THE INVENTION

In one aspect, the present invention provides methods of fabricating light emitting elements with improved throughput.

In another aspect, the present invention provides methods of fabricating light emitting devices using the methods of fabricating the light emitting elements.

In another aspect, the present invention provides light emitting elements fabricated by the methods of fabricating the light emitting elements.

In another aspect, the present invention provides light emitting devices fabricated using the light emitting elements.

According to an aspect of the present invention, there is provided a method of fabricating a light emitting element including: forming a buffer layer on at least one first substrate; bonding the at least one first substrate on a second substrate, wherein the buffer layer is placed between each of the first substrate and the second substrate and the second substrate is larger than the first substrate; exposing the buffer layer; and sequentially forming a first conductive layer, a light emitting layer, and a second conductive layer on the exposed buffer layer.

According to another aspect of the present invention, there is provided a light emitting element including: a conductive substrate; a buffer pattern, a first conductive pattern, a light emitting pattern, and a second conductive pattern that are sequentially stacked on a first side of the conductive substrate; a first electrode formed on a second side of the conductive substrate; and a second electrode formed on the second conductive pattern.

However, the aspects, features and advantages of the present invention are not restricted to the ones set forth herein. The above and other aspects, features and advantages of the present invention will become more apparent to one of ordinary skill in the art to which the present invention pertains by referencing a detailed description of embodiments of the present invention given below.

BRIEF DESCRIPTION OF THE DRAWINGS

The above and other features and advantages of the present invention will become apparent by describing in detail exemplary embodiments thereof with reference to the attached drawings in which.

DETAILED DESCRIPTION OF EMBODIMENTS OF THE INVENTION

Figure 1:
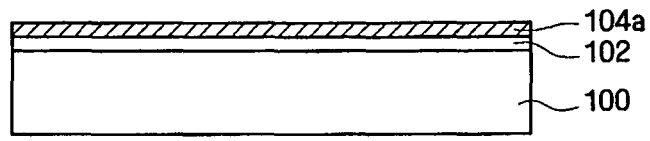
FIGS. 1 through 7 are intermediate drawings illustrating a method of fabricating a light emitting element according to a first exemplary embodiment of the present invention.

Embodiments of the present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete.

It will be understood that when an element is referred to as being "connected" or "coupled" to another element, it can be directly connected or coupled to the other element, or intervening elements may be present. In comparison, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on the "upper" sides of the other elements. Similarly, if the device in one of the figures is turned over, elements described as "below" or "beneath" other elements would then be oriented "above" or "over" the other elements. Therefore, the exemplary terms "below" and "beneath", for example, can encompass both an orientation of above and below.

FIGS. 1 through 7 are drawings illustrating a method of fabricating a light emitting element according to a first exemplary embodiment of the present invention. FIG. 8 is a perspective view illustrating a light emitting element according to a first exemplary embodiment of the present invention.

First, referring to FIG. 1, on at least one first substrate 100, a sacrificial layer 102 and a buffer layer 104a are formed sequentially.

In detail, the first substrate 100, for example, can be a dielectric substrate such as sapphire ($Al_2O_3$) and zinc oxide (ZnO), or a conductive substrate, such as silicon (Si) and silicon carbide (SiC). The first substrate 100 is not limited to the examples described above, and can be a material that can form the sacrificial layer 102 or the buffer layer 104a. Hereinafter, as an example, a sapphire substrate is used to describe the first substrate 100.

The sacrificial layer 102 is a layer that is removed when the first substrate 100 is separated using laser lift off (LLO) method. The sacrificial layer 102 can be formed of $In_xAl_yGa_{(1-x-y)}N$ ($0 \leq x \leq 1$, $0 \leq y \leq 1$) which can be melted with a laser. If other processes (for example, grinding, chemical mechanical polishing (CMP)) are used to remove the first substrate 100, the sacrificial layer 102 may not be formed.

The buffer layer 104a serves as a seed layer for forming (e.g., growing) a first conductive layer 112a. When the buffer layer 104a is used as a seed layer, crystallinity of the first conductive layer 112a, a light emitting layer 114a, and a second conductive layer 116a can be improved. A buffer layer 104a can be formed of $In_xAl_yGa_{(1-x-y)}N$ ($0 \leq x \leq 1$, $0 \leq y \leq 1$) or $Si_xC_yN_{(1-x-y)}$ ($0 \leq x \leq 1$, $0 \leq y \leq 1$).

The sacrificial layer 102 and the buffer layer 104a can be grown by using, for example, metal organic chemical vapor deposition (MOCVD), molecular beam epitaxy (MBE), liquid phase epitaxy (LPE), vapor phase epitaxy (VPE), and/or hydride vapor phase epitaxy (HVPE).

Figure 2:
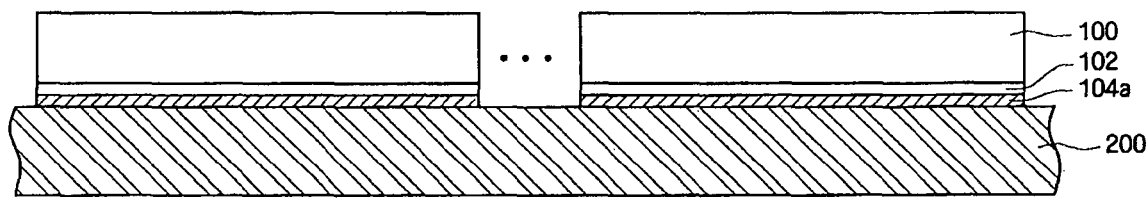
Figure 3:
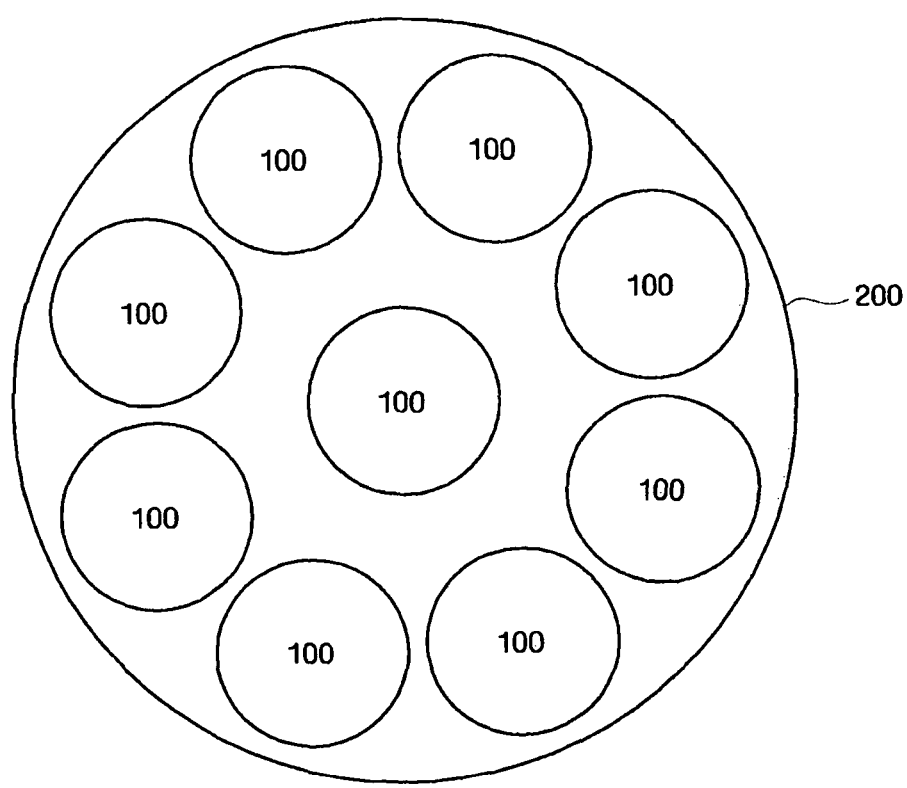

Next, referring to FIGS. 2 and 3, at least one of the first substrate 100 is bonded to a second substrate 200.

In detail, the second substrate 200 is larger than the first substrate 100. Thus, when the second substrate 200 is stacked on the first substrate 100, the first substrate 100 can not be seen since the second substrate 200 covers the first substrate 100. For example, where the second substrate 200 and the first substrate 100 are round in shape, the diameter of the second substrate 200 is greater than the diameter of the first substrate 100. For example, the diameter of the second substrate 200 can be equal to or greater than 6 inches (approximately 150 mm), and the diameter of the first substrate 100 can be less than 6 inches. Where the second substrate 200 and the first substrate 100 are rectangular in shape, the diagonal distance of the second substrate 200 is greater than the diagonal distance of the first substrate 100.

The second substrate 200 can be a conductive layer. For example, the second substrate 200 can be formed of a material including silicon, strained silicon, silicide, silicon-on-Insulator (SOI), silicon carbide (SiC), silicon germanium (SiGe), silicon germanium carbide (SiGeC), germanium, germanium alloy, gallium arsenide (GaAs), indium arsenide (InAs), a III-V semiconductor, and a II-VI semiconductor. Hereinafter, as an example, a silicon substrate is used to describe the second substrate 200.

Direct bonding can be used as an exemplary method to bond the first substrate 100 to the second substrate 200.

First, to bond the first substrate 100 to the second substrate 200 directly, in some embodiments, the first substrate 100 and the second substrate 200 have the following features.

A bonding side (i.e., a side that will be bonded) of the first substrate 100 and a bonding side of the second substrate 200 are substantially flat and smooth. The bonding side of the first substrate 100 is the side of the first substrate 100 where the buffer layer 104a is formed. In some embodiments, the buffer layer 104a is substantially flat and smooth since bonding can be difficult when the first substrate 100 and the bonding side of the second substrate 200 are bent and rough. In some embodiments, the total thickness variation is controlled to be below a certain value. For example, for an eight-inch wafer, the total thickness variation can be equal or below 6 μm, and for a two-inch wafer the total thickness variation can be equal or below 1.5 μm.

In certain embodiments, using semiconductor polishing technique, the bonding side of the first substrate 100 and/or the bonding side of the second substrate 200 can be polished. For example, using chemical mechanical polishing (CMP) surface roughness can be controlled in Angstrom units. The bonding side of the first substrate 100 and the bonding side of the second substrate 200 can have a surface roughness of below 1 nm when measured by atomic force microscopy (AFM). The bonding side of the first substrate 100 and/or the bonding side of the second substrate 200 can be mirror-polished.

In some embodiments, the bonding side of the first substrate 100 and/or the bonding side of the second substrate 200 are well-cleaned. The first substrate 100 and/or the second substrate 200 can be well-cleaned since impurities attached to the surface of the first substrate 100 and/or the second substrate 200 (for example, particles, dust) can be contamination sources. If impurities exist at the bonding interface between the first substrate 100 and the second substrate 200, the bonding energy can be weakened. If the bonding energy is weak, the first substrate 100 and the second substrate 200 can part easily.

To bond the first substrate 100 and the second substrate 200 directly, a pre-treatment can be performed on the bonding side of the second substrate 200 and at least one of the bonding sides of the first substrate 100 (as shown, the buffer layer 104a).

The pre-treatment, for example, can be plasma treatment or wet treatment. The plasma treatment can use, for example, at least one of $O_2$, $NH_3$, $SF_6$, Ar, $Cl_2$, $CHF_3$, and $H_2O$; however it is not limited to these materials. Since the plasma treatment can be performed at a low temperature, it can introduce less stress to the first and the second substrates 100, 200. The wet treatment can use, for example, at least one of $H_2SO_4$, $HNO_3$, HCl, $H_2O_2$, $H_5IO_6$, SC-1 (Standard Clean-1), SC-2 (Standard Clean-2); however it is not limited to these materials. SC-1 solution can be $NH_4OH/H_2O_2$, and SC-2 solution can be $HCl/H_2O_2$.

By performing the pre-treatment, the bonding side of the first substrate 100 and the bonding side of the second substrate 200 can be activated. That is, the bonding side of the first substrate 100 and the bonding side of the second substrate 200 can have a proper state for bonding. Dangling bonds can be formed on the bonding side of a substrate that is pre-treated. The dangling bonds can be hydrophilic dangling bonds or hydrophobic dangling bonds. For example, when the second substrate 200 is a silicon wafer and the first substrate 100 is a sapphire wafer, after pre-treatment, "—OH" bonds, which are hydrophilic dangling bonds can be formed on the bonding side of the first substrate 100 and the bonding side of the second substrate 200.

Next, the bonding side of the second substrate 200 and at least one of the bonding sides of the first substrate 100 (as shown, the buffer layer 104a) are placed facing each other. In this step, "—OH" bonds formed on the first substrate 100 spontaneously adhere to "—OH" bonds formed on the second substrate 200 due to Van der Waals' forces. As illustrated in FIG. 3 (a top view), on a second substrate 200 having a diameter of eight inches, nine substrates 100 each having a diameter of two inches can be placed. The number of first substrates 100 placed on the second substrate 200 can be determined based on the size difference between the first substrate 100 and the second substrate 200.

Then, the spontaneously adhered second substrate 200 and at least one of the first substrate 100 are compressed by performing a heat treatment. As a result, as illustrated in FIG. 2, the second substrate 200 and at least one of the first substrate 100 are connected by covalent bonds.

The heat treatment can be performed at a temperature between about 25° C. (room temperature) and about 400° C. Performing the heat treatment at a high temperature can increase the bonding energy between the second substrate 200 and the first substrate 100. However, if the heat treatment is performed at very high temperatures, the second substrate 200 and the first substrate 100 can bend or crack. Thus, the heat treatment should be performed in a proper temperature range. Also, although a longer time period for a heat treatment can increase the bonding energy, the bonding energy may not increase after a certain time period (for example, several hours).

Figure 4:
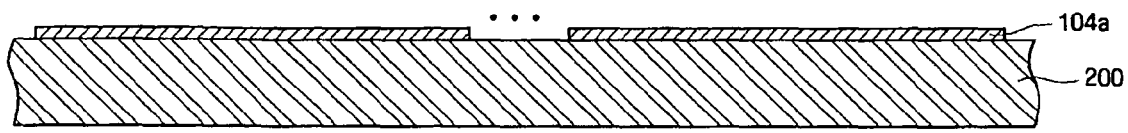

Next, referring to FIG. 4, the multiple first substrates 100 are removed. Removing the multiple first substrates 100 can be performed, for example, using a laser lift off (LLO) process, grinding, or a chemical mechanical polishing (CMP) process. The LLO process is described below in detail. A laser beam is irradiated from the side of the first substrate 100. Since the laser beam has a relatively small area, a relatively large area of the first substrate 100 is scanned. Using the laser beam, the sacrificial layer 102 is removed. Then, the first substrate 100 is subsequently separated from the irradiated area.

Before the laser lift off process, the thickness of the first substrate 100 can be reduced. As described previously, since the first substrate 100 is subsequently separated from the irradiated area, the buffer layer 104a can be broken or damaged due to the applied physical force when the first substrate 100 is separated. However, if the thickness of the first substrate 100 is made thinner, for example, by using a CMP process, any damage to the buffer layer 104a can be reduced since the physical force applied during separation of the first substrate 100 is decreased.

Figure 5:
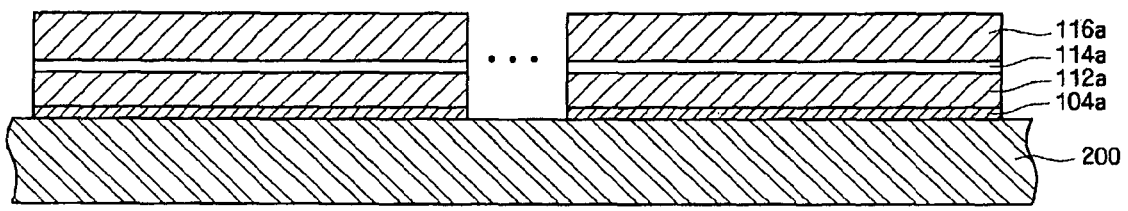

Then, referring to FIG. 5, on the buffer layer 104a exposed by removing the first substrate 100, the first conductive layer 112a, the light emitting layer 114a, and the second conductive layer 116a are sequentially formed.

The first conductive layer 112a, the light emitting layer 114a, and the second conductive layer 116a can include $In_xAl_yGa_{(1-x-y)}N$ ($0 \leq x \leq 1$, $0 \leq y \leq 1$) (i.e., various materials including GaN). The first conductive layer 112a, the light emitting layer 114a, and the second conductive layer 116a can include, for example, AlGaN or InGaN.

The first conductive layer 112a, the light emitting layer 114a, and the second conductive layer 116a can be sequentially formed on the buffer layer 104 using metal organic chemical vapor deposition (MOCVD), liquid phase epitaxy, hydride vapor phase epitaxy, molecular beam epitaxy, and metal organic vapor phase epitaxy (MOVPE), and so on. Each layer is described in detail below.

Although the first conductive layer 112a is a first conduction-type (for example, an n-type) and the second conductive layer 116a is a second conduction-type (for example, a p-type), depending on design method, the first conductive layer 112a can be the second conductive type (for example, a p-type) and the second conductive layer 116a can be the first conductive type (for example, an n-type).

The light emitting layer 114a is a region where carriers in the first conductive layer 112a (for example, electrons) and carriers in the second conductive layer 116a (for example, holes) are combined, and light is generated. Although not specifically illustrated in the drawing, the light emitting layer 114a can be formed with a well layer and a barrier layer. Since the well layer has a smaller band gap than the barrier layer, carriers (electrons, holes) are gathered in the well layer and combined. Such a light emitting layer 114a can be categorized as a Single Quantum Well (SQW) structure or a Multiple Quantum Well (MQW) structure, depending on a number of the well layers. The single quantum well structure includes one well layer, and the multiple quantum well structure includes multiple well layers. In order to control the light emitting characteristics, on at least one of the well layer and the barrier layer, at least one of B, P, Si, Mg, Zn, and Se can be used as a dopant.

Figure 6:
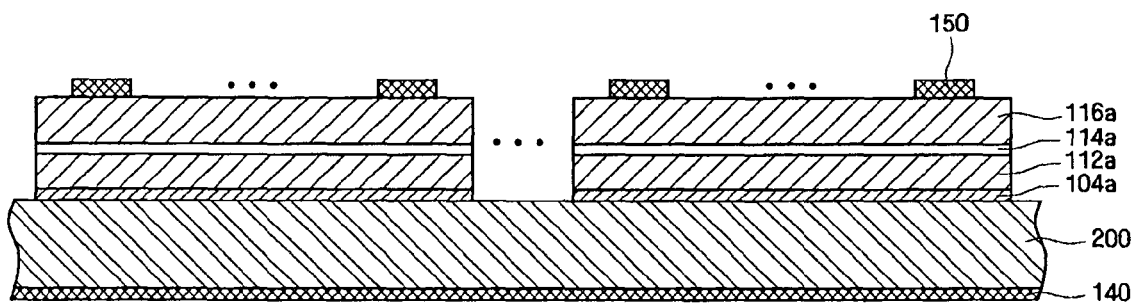

Next, referring to FIG. 6, on the other side of the second substrate 200, a first electrode 140 is formed, and on the second conductive layer 116a, a second electrode 150 is formed.

The first electrode 140 and the second electrode 150 can be formed using the same material or different materials. The first electrode 140 and the second electrode 150 can include, for example, at least one of indium tin oxide (ITO), silver (Ag), titanium (Ti), copper (Cu), nickel (Ni), aluminum (Al), chrome (Cr), gold (Au), platinum (Pt), vanadium (V), tungsten (W), and molybdenum (Mo).

The first electrode 140 and the second electrode 150 can be formed in any order. For example, the first electrode 140 can be formed first, and the second electrode 150 can be formed later. Alternatively, the second electrode 150 can be formed first, and the first electrode 140 can be formed later.

Also, a first ohmic layer (not shown) can be formed in between the first electrode 140 and the other side of the second substrate 200, and a second ohmic layer (not shown) can be formed in between the second electrode 150 and the second conductive layer 116a. The first and second ohmic layers, for example, can include at least one of ITO (Indium Tin Oxide), zinc oxide (ZnO), silver (Ag), titanium (Ti), aluminum (Al), gold (Au), nickel (Ni), indium oxide ($In_2O_3$), and tin oxide ($SnO_2$).

Also, before or after forming the second electrode 150, texture can be formed on the surface of the second conductive layer 116a by performing a surface texturing process. The texture can be formed, for example, by performing a wet etch on the surface of the second conductive layer 116a using an etchant such as KOH.

Also, before forming the first electrode 140, the thickness of the second substrate 200 can be controlled (e.g., smoothed and/or reduced). For example, after controlling the thickness of the second substrate 200 using grinding, CMP process, or an etch process, the first electrode 140 can be formed.

Figure 7:
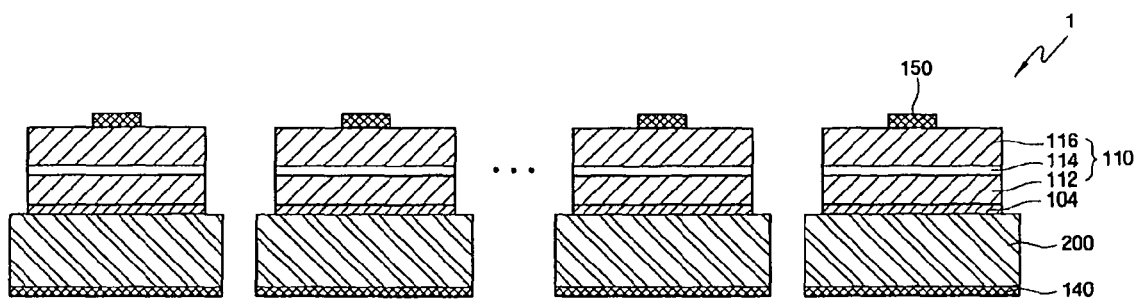
Figure 8:
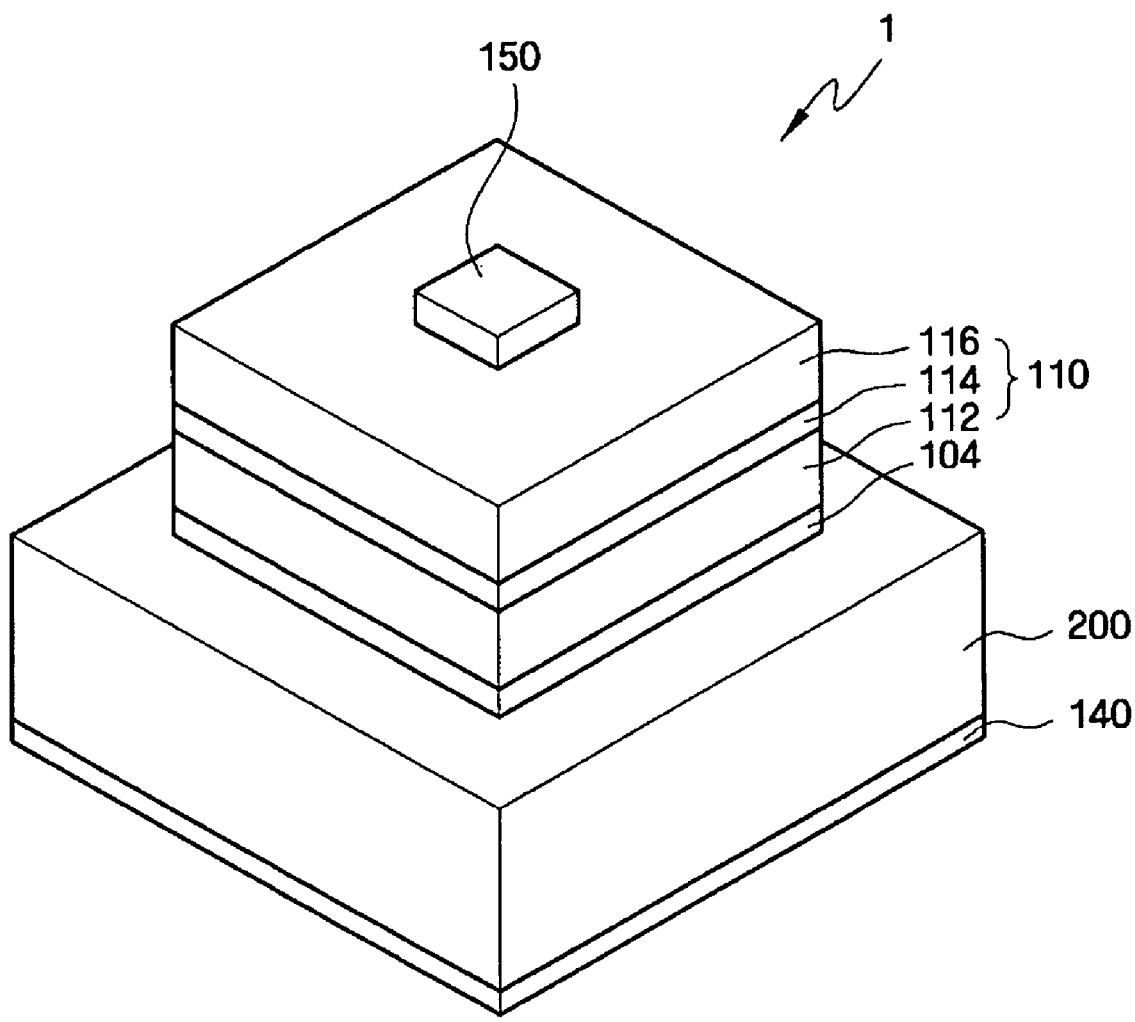
FIG. 8 is a perspective view illustrating a light emitting element according to a first exemplary embodiment of the present invention.

Next, referring to FIG. 7, by patterning the first conductive layer 112a, the light emitting layer 114a, and the second conductive layer 116a into chip units, a first conductive pattern 112, a light emitting pattern 114, and a second conductive pattern 116 are formed.

Then, after separating the chip units using a sawing process, a light emitting element 1 is completed.

As described earlier, if a fabrication process is performed by bonding the multiple small first substrates 100 onto the large second substrate 200, fabrication equipment for the size of the large second substrate 200 is used and thus extra equipment for the small first substrate 100 is not needed. Also, since fabrication process is performed on multiple first substrates 100 at one time, throughput is improved. Thus, the unit cost of the light emitting element 1 can be reduced.

Referring to FIG. 8, a light emitting element 1 according to a first exemplary embodiment of the present invention will now be described. The light emitting element 1 according to the first exemplary embodiment of the present invention is fabricated by the fabrication method illustrated in FIGS. 1 through 7.

Referring FIG. 8, the light emitting element 1 includes a second substrate 200, and a buffer pattern 104, a first conductive pattern 112, a light emitting pattern 114, and a second conductive pattern 116, which are sequentially stacked on one side of the second substrate 200. As used herein, a stacked structure which has the first conductive pattern 112, the light emitting pattern 114, and the second conductive pattern 116 is called a light emitting structure 110. Also, a first electrode 140 formed on the other side of the second substrate 200 and a second electrode 150 formed on the second conductive pattern 116 are included. The first electrode 140 is connected to the first conductive pattern 112 electrically through the conductive second substrate 200 and the buffer pattern 104.

Although it is illustrated that sidewalls of the first conductive pattern 112, the light emitting pattern 114, and the second conductive pattern 116 are aligned, they are not so limited. Also, although it is illustrated that the width of the light emitting pattern 114 is smaller than the width of the second substrate 200, it is not so limited. For example, the width of the light emitting pattern 114 can be substantially the same as the width of the second substrate 200.

The operations of the light emitting element 1 are described below.

When the second conductive pattern 116 is p-type and the first conductive pattern 112 is n-type, a first bias (V+ or I+) is applied to the second conductive pattern 116 through the second electrode 150, and the second bias (V−, I−, or ground) is applied to the first conductive pattern 112 through the first electrode 140, the second substrate 200, and the buffer pattern 104. Since the first bias (V+ or I+) is applied to the second conductive pattern 116 and the second bias (V−, I−, or ground) is applied to the first conductive pattern 112, a forward bias is applied to the light emitting structure 110. Due to the forward bias, the light emitting pattern 114 can emit light.

When the second conductive pattern 116 is n-type and the first conductive pattern is p-type, the first bias (V+ or I+) is applied to the first conductive pattern 112 through the first electrode 140, the second substrate 200, and the buffer pattern 104, and the second bias (V−, I−, or ground) is applied to the second conductive pattern 116 through the second electrode 150.

Figure 9:
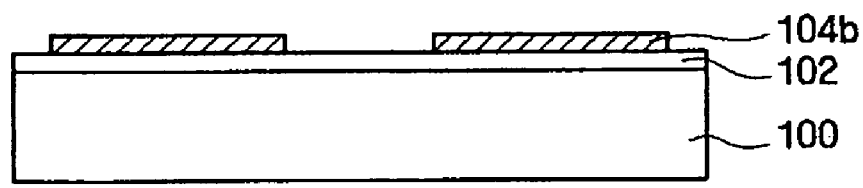
FIG. 9 is an intermediate sectional view illustrating a method of fabricating a light emitting element according to a second exemplary embodiment of the present invention.
Figure 10:
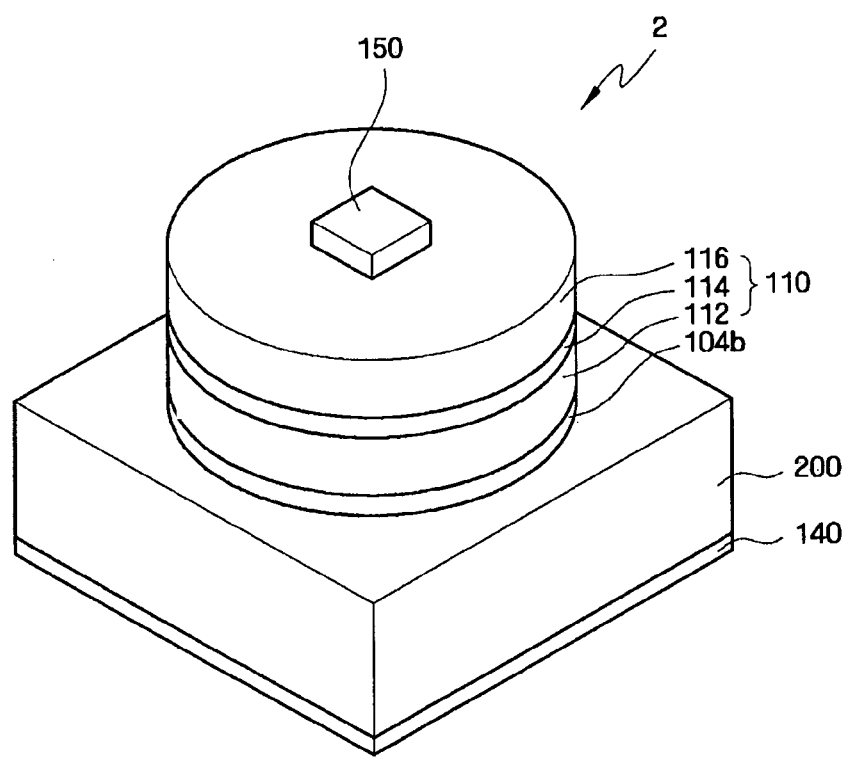
FIG. 10 is a perspective view illustrating a light emitting element according to a second exemplary embodiment of the present invention.

FIG. 9 is an intermediate sectional view illustrating a method of fabricating a light emitting element according to a second exemplary embodiment of the present invention. FIG. 10 is a perspective view illustrating a light emitting element according to a second exemplary embodiment of the present invention. Hereinafter, differences compared to the method of fabricating the light emitting package according to the first exemplary embodiment of the present invention are mainly described.

The fabrication method according the second exemplary embodiment of the present invention is different from the first exemplary embodiment in that after forming a sacrificial layer 102 and a buffer layer 104a on at least one first substrate 100 (referring to FIG. 1), a buffer pattern 104b is formed by patterning the buffer layer 104a (referring to FIG. 9). The buffer pattern 104b can be patterned in various shapes. For example, a cylinder shape can be patterned.

When the first conductive pattern 112, the light emitting pattern 114, and the second conductive pattern 116 are grown on the buffer pattern 104b (e.g., using liquid phase epitaxy), hydride vapor phase epitaxy, molecular beam epitaxy, or MOVPE, the first conductive pattern 112, the light emitting pattern 114, and the second conductive pattern 116 can be formed according to the shape of the buffer pattern 104b. Thus, according to the fabrication method based on the second exemplary embodiment of the present invention, various shapes of light emitting structures 110 can be made.

If the buffer pattern 104b is a cylinder in shape, as illustrated in FIG. 10 the first conductive pattern 112, the light emitting pattern 114, and the second conductive pattern 116 can be cylindrical in shape. If the light emitting structure 110 is cylindrical in shape, a top view of the light emitting structure 110 can be in round shape. Light generated from the light emitting structure 110 can exit the light emitting structure 110 easily.

Figure 11:
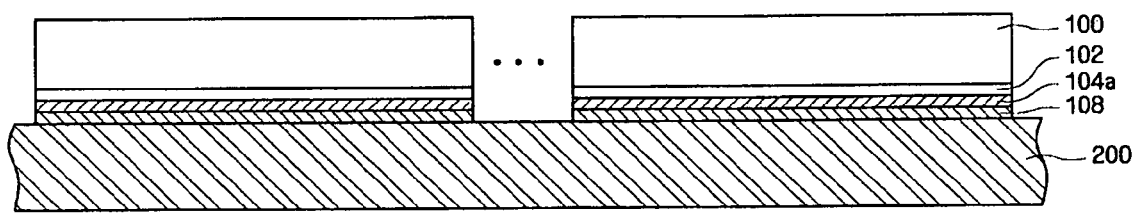
FIG. 11 is an intermediate sectional view illustrating a method of fabricating a light emitting element according to a third exemplary embodiment of the present invention.
Figure 12:
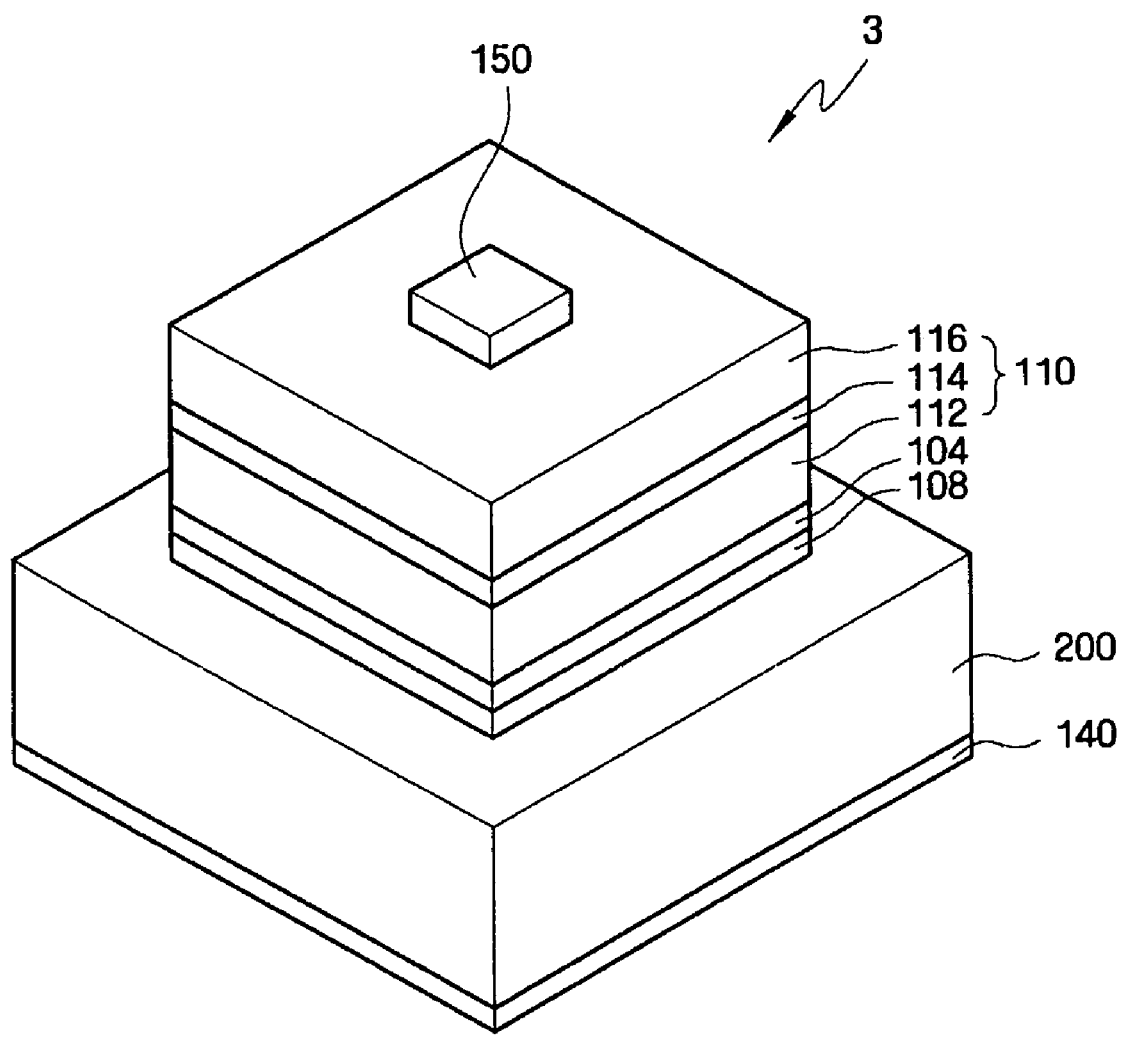
FIG. 12 is a perspective view illustrating a light emitting element according to a third exemplary embodiment of the present invention.

FIG. 11 is an intermediate sectional view illustrating a method of fabricating a light emitting element according to a third exemplary embodiment of the present invention. FIG. 12 is a perspective view illustrating a light emitting element according to a third exemplary embodiment of the present invention. Hereinafter, differences compared to the method of fabricating the light emitting package according to the first exemplary embodiment of the present invention are mainly described.

Referring to FIG. 11, the fabrication method according to the third exemplary embodiment of the present invention is different from the first exemplary embodiment in that at least one first substrate 100 is formed on a second substrate 200 using adhesive bonding.

An intermediate material layer 108 is formed on a bonding side of the second substrate 200 or at least one bonding side of the first substrate 100. As shown in FIG. 11, to aid understanding, the intermediate material layer 108 is formed on one bonding side of the first substrate 100. The intermediate material layer 108 can be conductive material, for example, a metal layer. If the intermediate material layer 108 is a metal layer, the metal layer can include at least one of Au, Ag, Pt, Ni, Cu, Sn, Al, Pb, Cr, and Ti. The metal layer can be a single layer, a stacked layer, or a combination layer thereof. For example, the metal layer can be a single layer of Au, a double layer of Au—Sn, and a multi-layer of Au and Sn stacked alternately multiple times.

Next, each bonding sides of at least one of the first substrate 100 and the bonding side of the second substrate 200 are positioned to face each other. Thus, the intermediate material layer 108 is placed between the first substrate 100 and the second substrate 200. Then, the second substrate 200 and at least one of the first substrate 100 are bonded by performing a heat treatment.

Hereinafter, a light emitting device fabricated by using the previously described light emitting elements 1-3 is described. To aid understanding, the light emitting device is illustrated using the light emitting element 1 according to the first exemplary embodiment of the present invention; however, the light emitting device is not limited thereto. For those who skilled in the art of the present invention, it can be clear that the light emitting device can be similarly made using the light emitting elements 2, 3.

Figure 13:
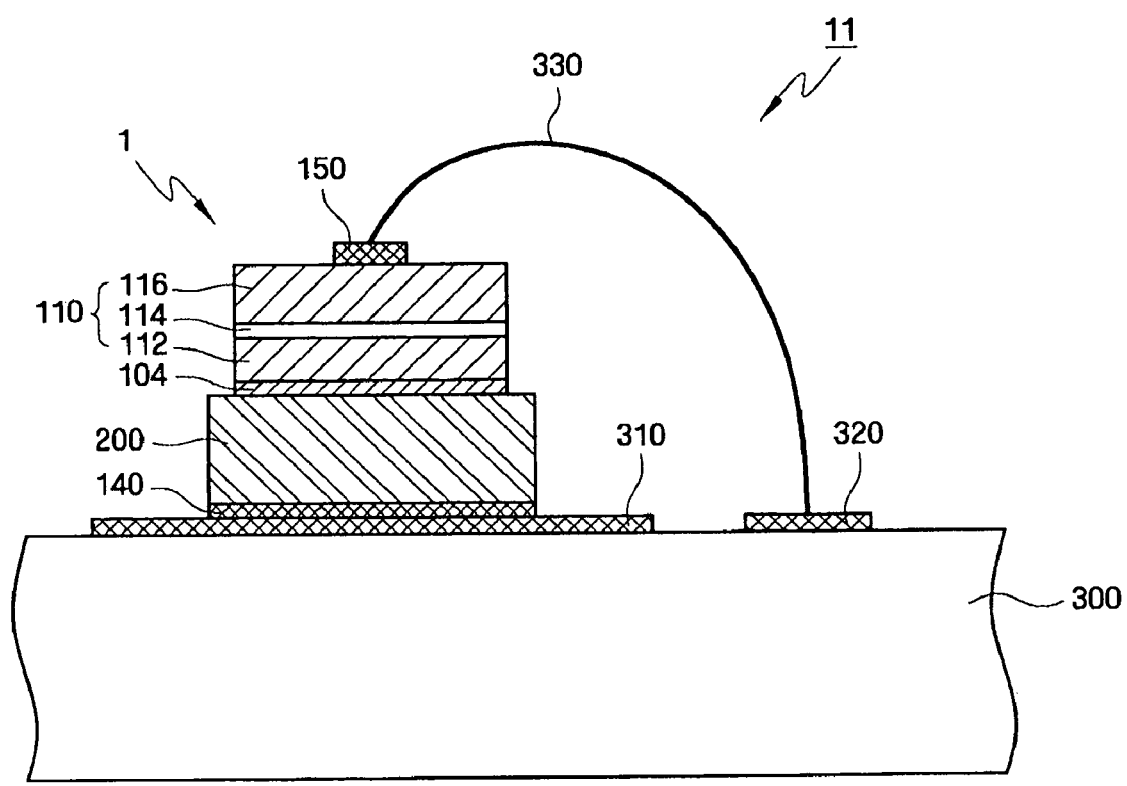
FIG. 13 is a sectional view illustrating a light emitting device according to a first exemplary embodiment of the present invention.

FIG. 13 is a sectional view illustrating a light emitting device according to a first exemplary embodiment of the present invention.

Referring to FIG. 13, a light emitting device 11 according to the first exemplary embodiment includes a circuit substrate 300, and a light emitting element 1 placed on the circuit substrate 300.

The circuit substrate 300 includes a first conductive region 310 and a second conductive region 320 that are electrically isolated. The first conductive region 310 and the second conductive region 320 are placed on one side of the circuit substrate 300.

The first conductive region 310 is electrically connected to a first electrode 140 of the light emitting element 1, and the second conductive region 320 is electrically connected to a second electrode 150 of the light emitting element 1. The second conductive region 320 and the second electrode 150 can be connected through a wire 330 (a wire bonding method). Since the second substrate 200 is a conductive substrate, the first conductive region 310 and the first electrode 140 can be electrically connected without an additional wire.

Figure 14:
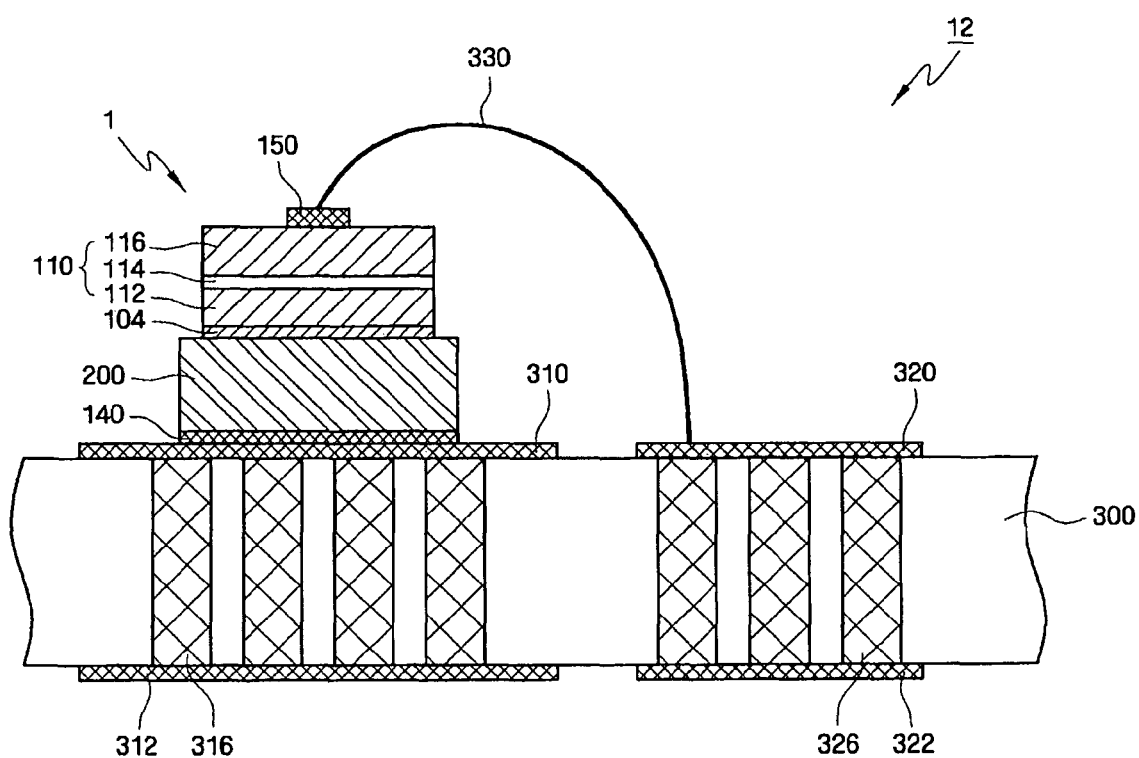
FIG. 14 is a sectional view illustrating a light emitting device according to a second exemplary embodiment of the present invention.

FIG. 14 is a sectional view illustrating a light emitting device according to a second exemplary embodiment of the present invention.

Referring to FIG. 14, a light emitting device 12 according to the second exemplary embodiment of the present invention is different from the first exemplary embodiment in that the circuit substrate 300 contains through vias 316, 326.

In detail, on one side of the circuit substrate 300 a first conductive region 310 and a second conductive region 320 that are electrically isolated are formed, and on the other side of the circuit substrate 300, a third conductive region 312 and a fourth conductive region 322 that are electrically isolated are formed. The first conductive region 310 and the third conductive region 312 are connected through the first through via 316, and the second conductive region 320 and the fourth conductive region 322 are connected through the second through via 326. The first conductive region 310 and a first electrode 140 of the light emitting element 1 are electrically connected, and the second conductive region 320 and a second electrode 150 of the light emitting element 1 are electrically connected.

Figure 15:
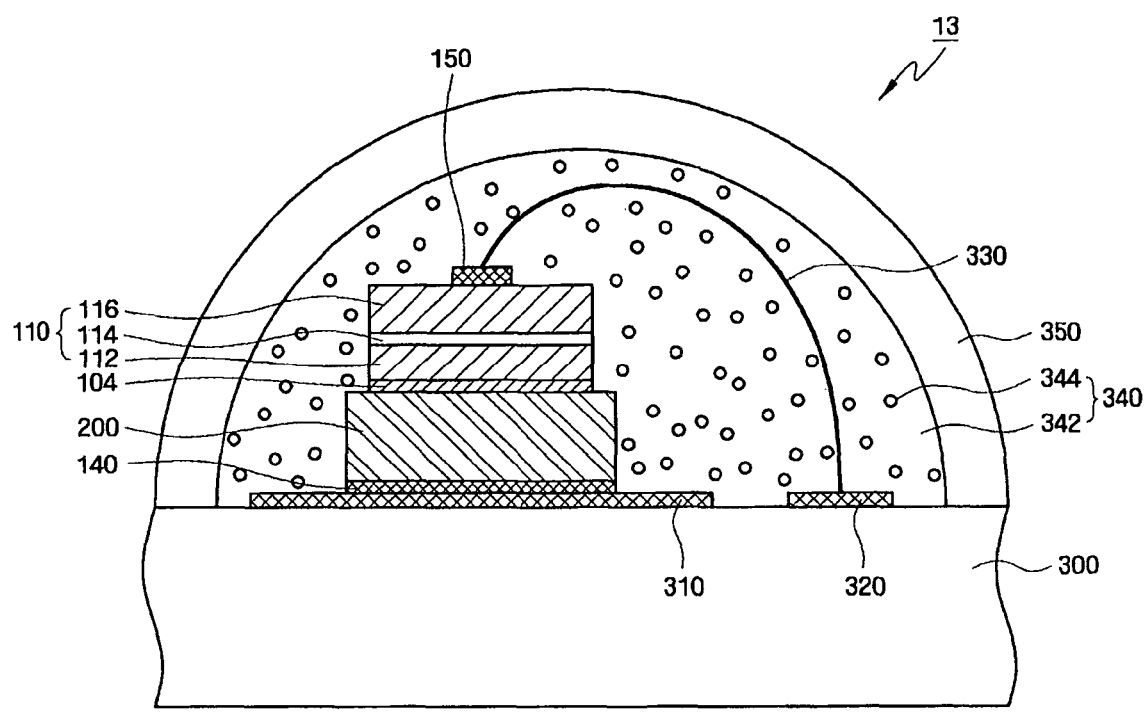
FIG. 15 is a sectional view illustrating a light emitting device according to a third exemplary embodiment of the present invention.

FIG. 15 is a sectional view illustrating a light emitting device according to a third exemplary embodiment of the present invention.

Referring to FIG. 15, a light emitting device 13 according to the third exemplary embodiment of the present invention is different from the first exemplary embodiment in that a light emitting device 13 includes a phosphorescence layer 340 that surrounds a light emitting element 1, and a second transparent resin 350 that surrounds the phosphorescence layer 340.

The phosphorescence layer 340 can be a combination of a first transparent resin 342 and a phosphor 344. Since the phosphor 344 distributed in the phosphorescence layer 340 absorbs light generated from the light emitting element 1 and turns the absorbed light into light with a different wave length, light emitting characteristics can be improved with better distribution of the phosphor 344. Wave length change and color mixing effect due to the phosphor 344 can be improved. As illustrated in the drawing, in order to protect a wire 330, the phosphorescence layer 340 can be formed over (e.g., higher than) the wire 330.

As an example, the light emitting device 13 can include the phosphorescence layer 340 to create white color. If the light emitting element 1 emits light with blue wavelength, the phosphor 344 can include yellow phosphor, and can additionally include red phosphor to improve characteristics of color rendering index, CRI. Also, if the light emitting element 1 emits light with a UV wavelength, the phosphor 344 can include all RGB (Red, Green, and Blue) phosphors.

For the first transparent resin 342, any material that can distribute the phosphor 344 stably can be used. For example, epoxy resin, silicone resin, hard silicone resin, modified silicone resin, urethane resin, oxetane resin, acrylic resin, polycarbonate resin, and polyimide resin can be used.

The phosphor 344 can be any material that can absorb light created from the light emitting structure 100 and turn the absorbed light into light with a different wavelength. For example, the phosphor 344 can be at least one selected from the group consisting of nitride/oxynitride based phosphor mainly activated by lanthanides such as Eu and Ce, alkaline earth halogen apatite phosphors mainly activated by lanthanides such as Eu and transition metals such as Mn, alkaline earth metal boron halogen phosphors, alkaline earth metal aluminate phosphors, alkaline earth silicate phosphors, alkaline metal sulfured phosphors, alkaline earth thiogallate phosphors, alkaline earth silicon nitride phosphors, germinates, rare earth aluminates mainly activated by lanthanides such as Ce, rare earth silicates, and organic compounds and organic complexes mainly activated by lanthanides such as Eu.

The following phosphors can be used for specific examples, but are not limited thereto. Nitride-based phosphors mainly activated by lanthanides such as Eu and Ce can be $M_2Si_5N_8$:Eu (M is at least one selected from the group consisting of Sr, Ca, Ba, Mg, and Zn). Also, the nitride phosphor mainly activated by lanthanoid series element such as Eu and Ce can be $M2Si_5N_8$:Eu, $MSi_7No$:Eu, $M_{1.8}Si_5O_{0.2}N_8$:Eu, and $M_{0.9}Si_7O_{0.1}N_{10}$:Eu (M is at least one selected from the group consisting of Sr, Ca, Ba, Mg, and Zn). Oxynitride-based phosphors mainly activated by lanthanides such as Eu and Ce can be $MSi_2O_2N_2$:Eu (M is at least one selected from the group consisting of Sr, Ca, Ba, Mg, and Zn). Alkaline earth halogen apatite phosphors mainly activated by lanthanides such as Eu and transition metals such as Mn can be oxynitride phosphors mainly activated by lanthanides such as Eu and Ce can be $M_5(PO_4)_3X$:R (M is at least one selected from the group of Sr, Ca, Ba, Mg, and Zn, X is at least one selected from the group consisting of F, Cl, Br, and I, and R is at least one selected from the group consisting of Eu, Mn, and Eu). Alkaline earth metal boron halogen phosphors can be $M_2B_5O_9X$:R (M is at least one selected from the group consisting of Sr, Ca, Ba, Mg, and Zn, X is at least one selected from the group consisting of F, Cl, Br, and I, R is at least one selected from the group of Eu and Mn.) Alkaline earth metal aluminate phosphors can be $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least one selected from the group consisting of Eu and Mn). Oxysulfide phosphors can be $La_2O_2S$:Eu, $Y_2O_2S$:Eu, $Gd_2O_2S$:Eu, and so on. Rare earth aluminate phosphors mainly activated by lanthanides such as Ce can be YAG series phosphors such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5 O_{12}$. Also, $Tb_3Al_5O_{12}$:Ce, and so on, which can be wholly or partially substituted with Tb or Lu. Alkaline earth silicate phosphors can include, for example, $(SrBa)_2SiO_4$:Eu. In addition, ZnS:Eu, $Zn_2GeO_4$:Mn, and $MGa_2S_4$:Eu (M is one selected from the group consisting of Sr, Ca, Ba, Mg, and Zn and X is one selected from the group consisting of F, Cl, Br, and I) can be used.

The phosphors described previously can include at least one selected from the group consisting of Tb, Cu, Ag, Au, Cr, Nd, Dy, Co, Ni, and Ti instead of Eu or in addition to Eu.

Also, phosphors, other than the phosphors described previously, that have the same or substantially similar performance and effects can be used.

As shown, the second transparent resin 350 has the shape of a lens and diffuses light created from the light emitting element 1. By controlling the curvature and the flatness of the second transparent resin 350, diffusion/extraction characteristics can be controlled. As shown, the second transparent resin 350 is formed to surround the phosphorescence layer 340 and can protect the phosphorescence layer 340. In humid conditions, the characteristics of phosphor 344 can be deteriorated.

Any material that allows light penetration can be used as the second transparent resin 350. For example, epoxy resins, silicone resins, hard silicone resins, modified silicone resins, urethane resins, oxetane resins, acrylic resins, polycarbonate resins, and polyimides can be used.

Figure 16:
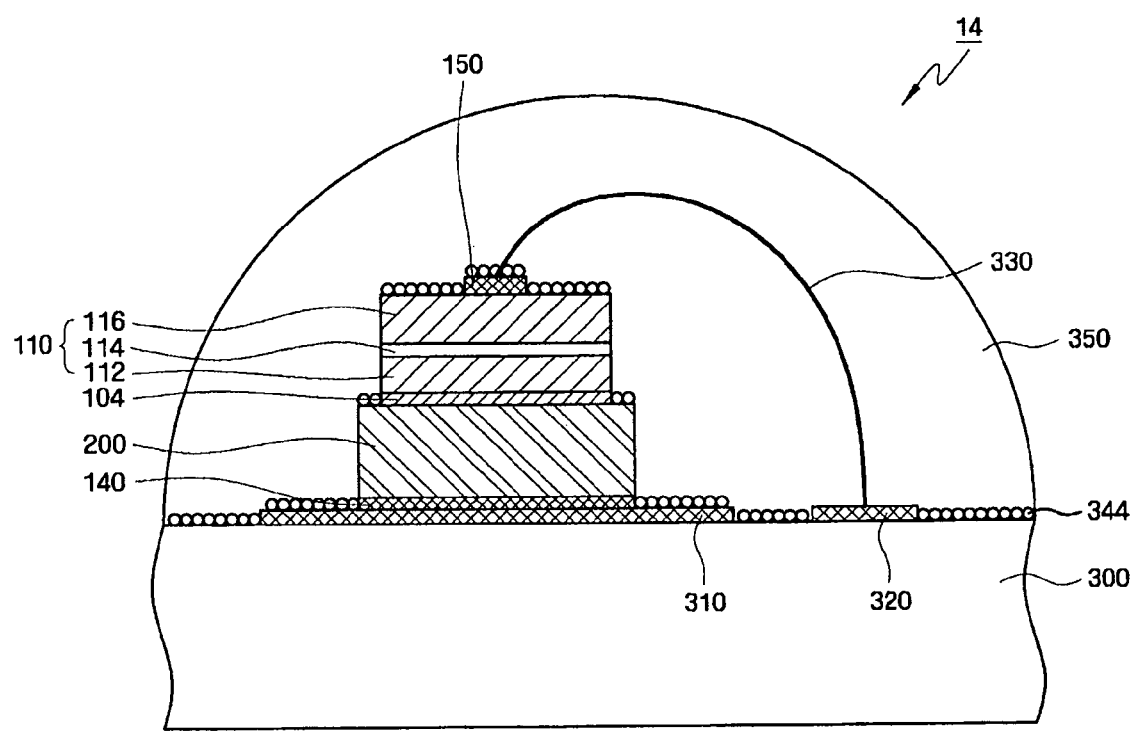
FIG. 16 is a sectional view illustrating a light emitting device according to a fourth exemplary embodiment of the present invention.

FIG. 16 is a sectional view illustrating a light emitting device according to a fourth exemplary embodiment of the present invention.

Referring to FIG. 16, a phosphor 344 is formed along with a profile of a light emitting element 1 and a circuit substrate 300.

As shown, the phosphor 344 can be applied without an extra first transparent resin (referring to 342 in FIG. 15).

In case where the phosphor 344 is applied without the extra first transparent resin, the transparent resin that surrounds the light emitting element 1 becomes a single layer (i.e., a single layer of 350 without 342).

Figure 17:
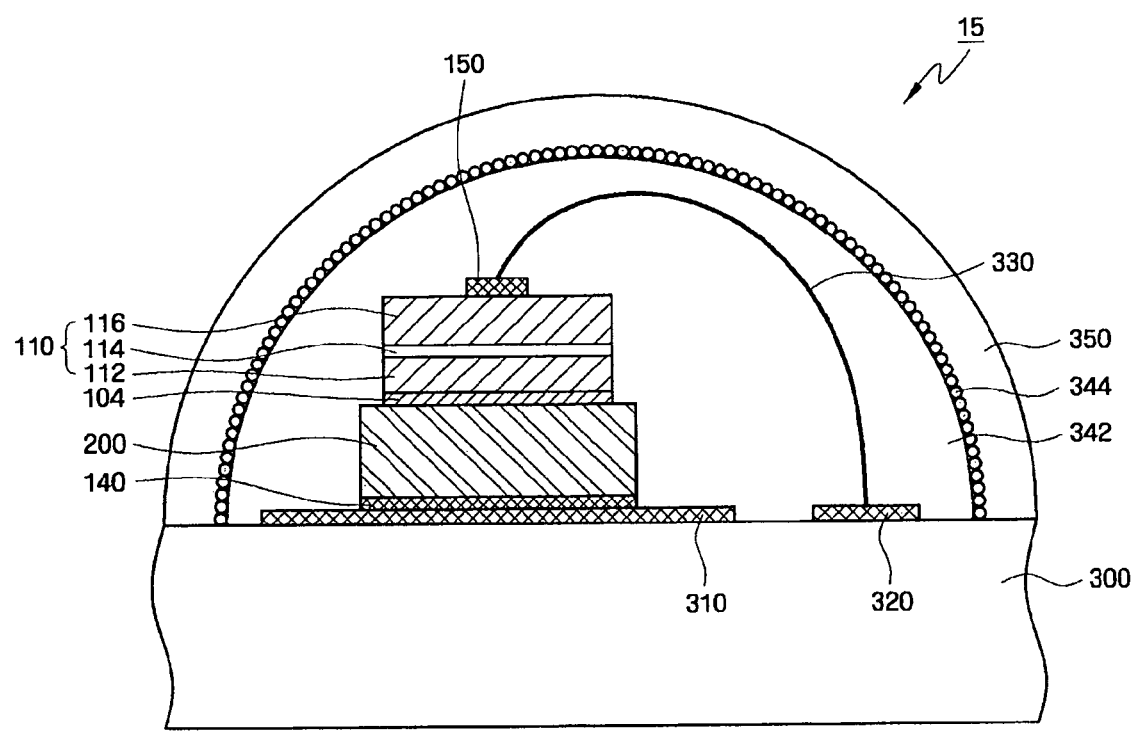
FIG. 17 is a sectional view illustrating a light emitting device according to a fifth exemplary embodiment of the present invention.

FIG. 17 is a sectional view illustrating a light emitting device according to a fifth exemplary embodiment of the present invention.

Referring to FIG. 17, a light emitting device 15 according to the fifth exemplary embodiment of the present invention is different from the third exemplary embodiment in that the light emitting device 15 according to the fifth exemplary embodiment includes a first transparent resin 342 that surrounds a light emitting element 1, a phosphor 344 formed on the first transparent resin 342, and a second transparent resin 350 formed on the phosphor 344.

Since the first transparent resin 342 and the phosphor 344 are applied separately rather than applied mixed together, the phosphor 344 can be formed thinly and conformally along with the surface of the first transparent resin 342.

Figure 18:
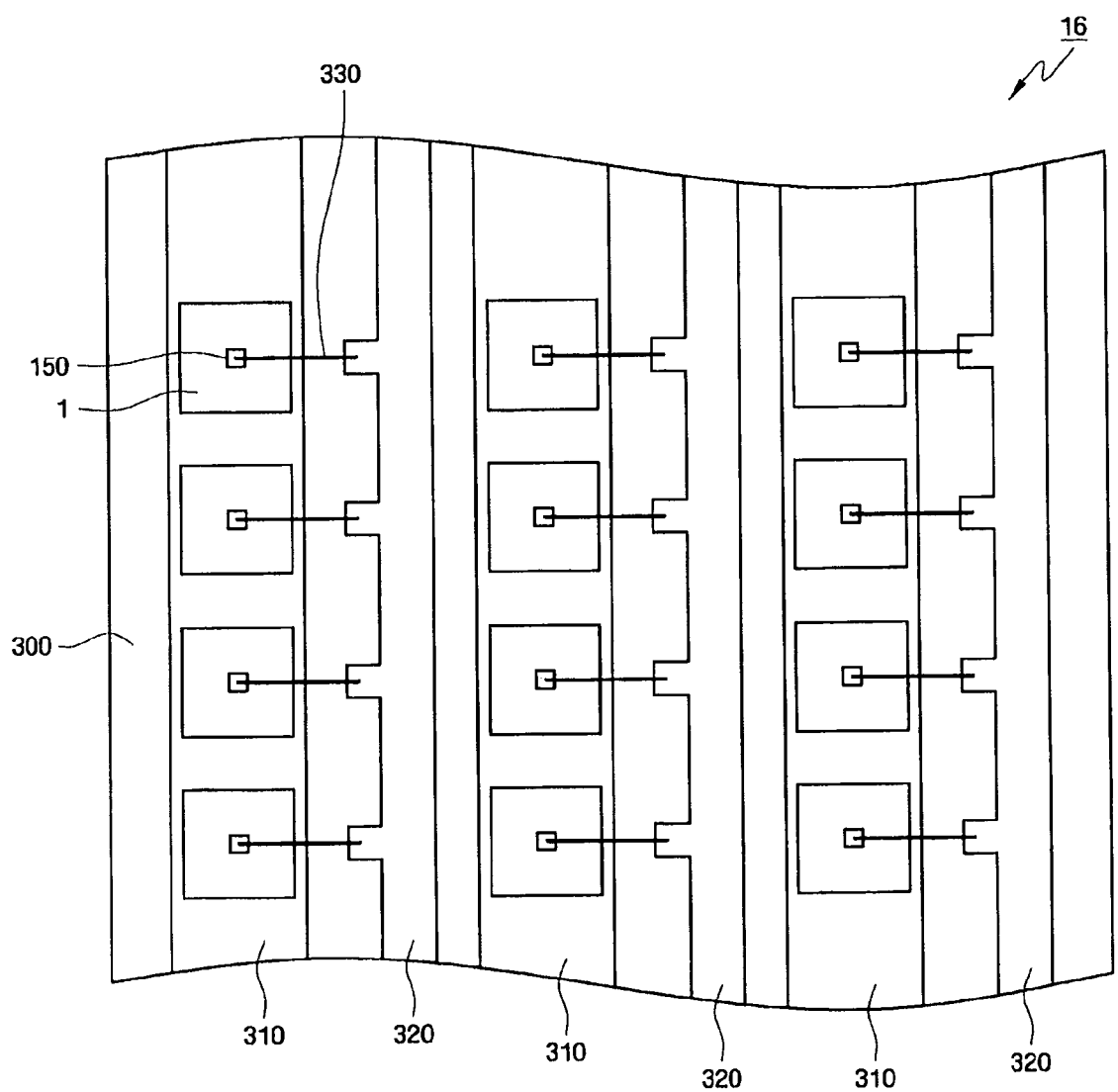
FIGS. 18 through 20 are drawings illustrating a light emitting device according to a sixth exemplary embodiment of the present invention.
Figure 19:
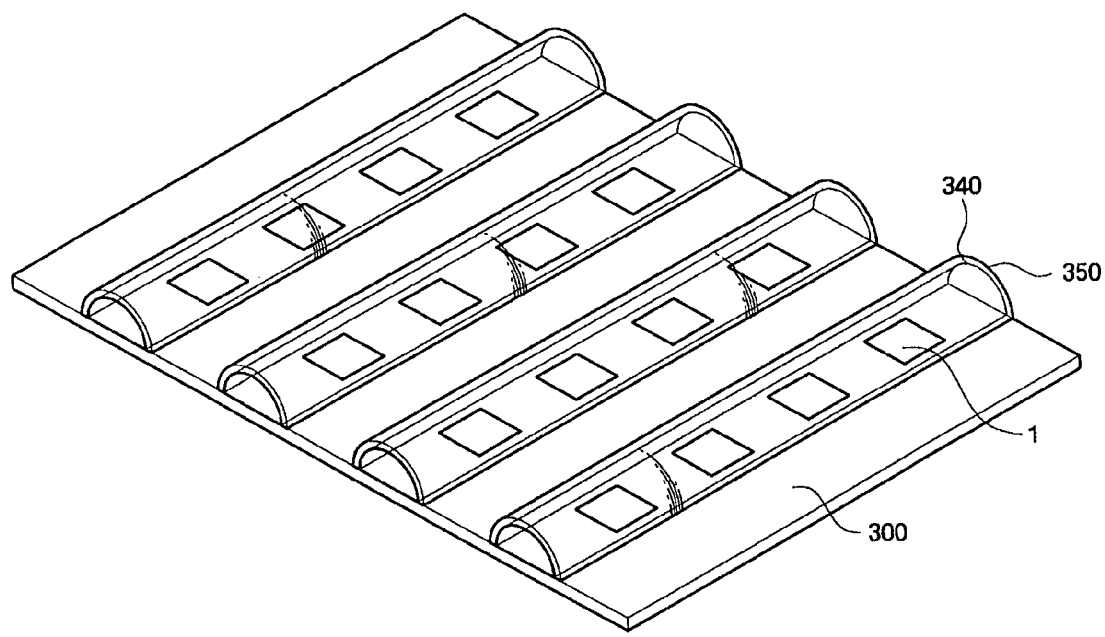
Figure 20:
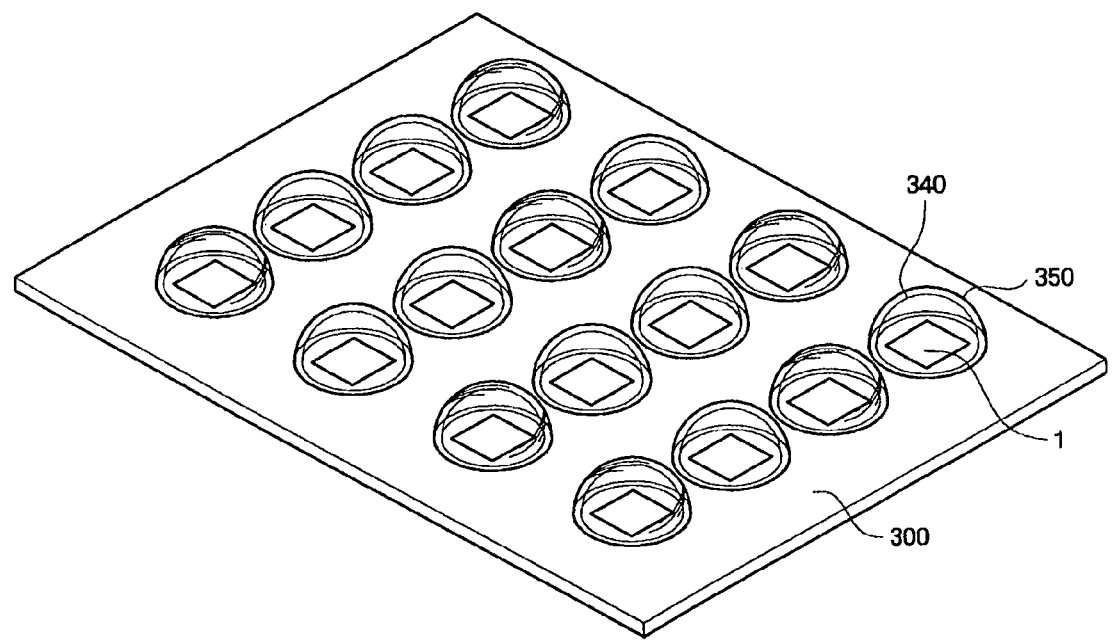

FIGS. 18 through 20 are drawings illustrating a light emitting device according to a sixth exemplary embodiment of the present invention. In detail, FIGS. 18 through 20 are drawings illustrating a circuit substrate on which a plurality of light emitting element is placed, or a light emitting element array. FIGS. 19 and 20 are drawings illustrating a phosphorescence layer 340 and a second transparent resin 350 formed on the light emitting element array.

First, referring to FIG. 18, on a circuit substrate 300, a first conductive region 310 and a second conductive region 320 extending in one direction in parallel. A light emitting element 1 is placed on the first conductive region 310 in a line along the long extended direction of the first conductive region 310. A second electrode 150 of a light emitting element 1 and the second conductive region 320 are connected through a wire 330.

When a first bias is applied to the first conductive region 310 and a second bias is applied to the second conductive region 320, a forward bias is applied to a light emitting structure (not shown) inside the light emitting element 1, and the light emitting element 1 emits light.

Referring to FIG. 19, the phosphorescence layer 340 and the second transparent resin 350 can be formed as a line type. For example, as illustrated in FIG. 18, when the light emitting element 1 is placed along the long extended direction of the first conductive region 310, the phosphorescence layer 340 and the second transparent resin 350 can be placed along the long extended direction of the first conductive region 310. Also, the phosphorescence layer 340 and the second transparent resin 350 can be formed such that they surround both the first conductive region 310 and the second conductive region 320.

Referring to FIG. 20, the phosphorescence layer 340 and the second transparent resin 350 can be formed as a dot type. The phosphorescence layer 340 and the second transparent resin 350 can be formed such that they surround only the corresponding light emitting element 1.

Figure 21:
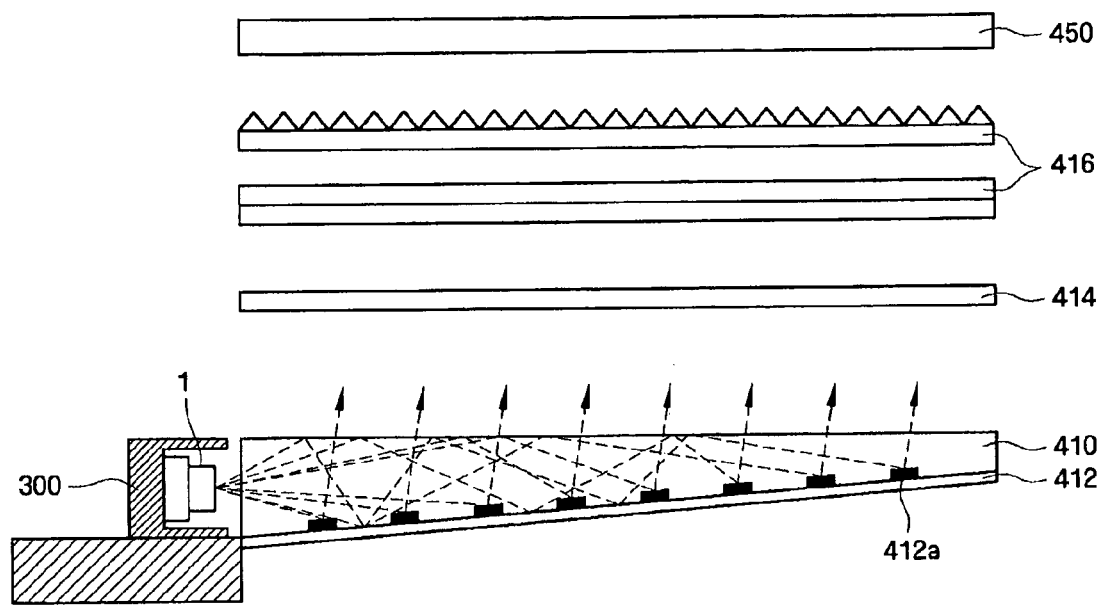
FIG. 21 is a sectional view illustrating a light emitting device according to a seventh exemplary embodiment of the present invention.

FIG. 21 is a sectional view illustrating a light emitting device according to a seventh exemplary embodiment of the present invention.

FIG. 21 illustrates a light emitting device according to the seventh exemplary embodiment of the present invention that is an end product. The light emitting device illustrated in FIG. 21 can be used in various devices, including a light device, a display device, or mobile device (e.g., cellular phone, MP3 player, navigation, and so on). The exemplary device illustrated in FIG. 21 is an edge type back light unit (BLU) used in liquid crystal displays (LCDs). Since LCDs do not include a self light source, a BLU is used as the light source and the BLU mainly emits light from the back of an LCD panel.

Referring to FIG. 21, the BLU includes a light emitting element 1, a light guide panel 410, a reflection panel 412, a diffusion sheet 414, and a pair of prism sheet 416.

The light emitting element 1 provides light. The light emitting element 1 can be a side view type light emitting element.

The light guide panel 410 guides light supplied to a liquid crystal panel 450. The light guide panel 410 is formed of a transparent material, such as an acrylic resin, and it moves light created from the light emitting device 11 toward the liquid crystal panel 450 placed on the light guide panel 410. Thus, on a rear side of the light guide panel 410, various kinds of patterns 412a are printed to change the movement direction of light entered into the light guide panel 410 toward the liquid crystal panel 450.

The reflection panel 412 is installed on the bottom side of the light guide panel 410 and reflects light discharged to the bottom of the light guide panel 410. The reflection panel 412 reflects light that is not reflected by the various kinds of patterns 412a toward an output face of the light guide panel 410. As a result, light loss is reduced and uniformness of light that penetrates the output face of the light guide panel 410 is improved.

The diffusion sheet 414 diffuses light that comes out of the light guide panel 410 and prevents light from partial congestion.

On the prism sheet 416, triangular prisms are formed in a uniform arrangement. Typically, the prism sheet 416 consists of two sheets, and the prisms are arranged to cross each other at certain angles to allow light diffused from the diffusion sheet 414 to move vertically to the liquid crystal panel 450.

FIGS. 22 through 25 are drawings illustrating a light emitting device according to eighth through eleventh exemplary embodiments of the present invention.

Figure 22:
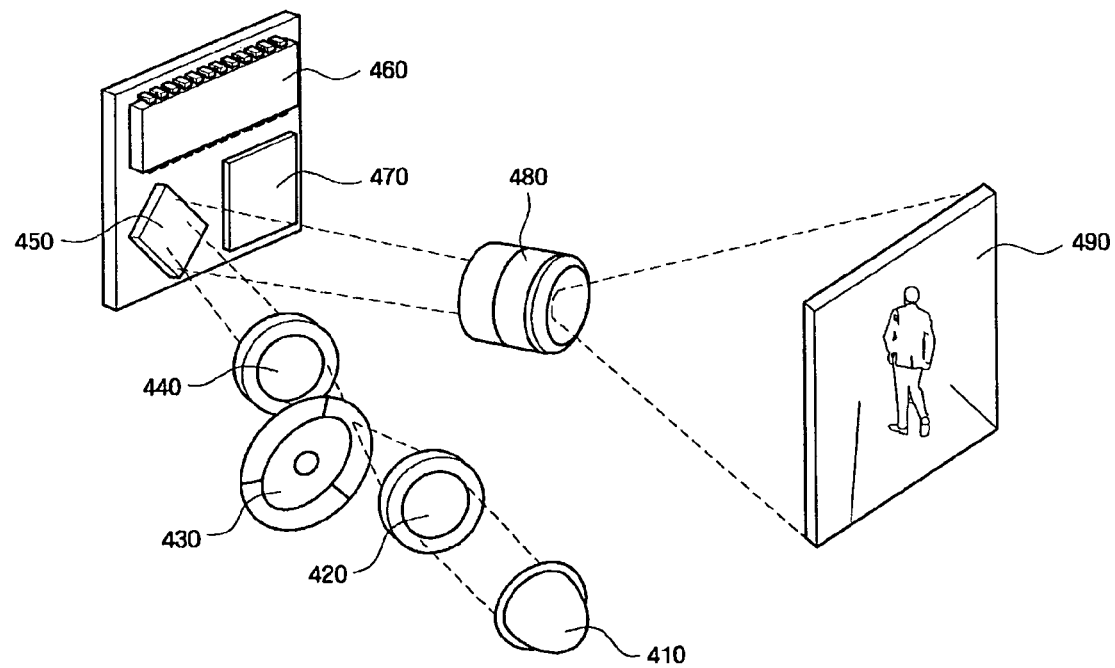
FIGS. 22 through 25 are drawings illustrating a light emitting device according to eighth through eleventh exemplary embodiments of the present invention.
Figure 23:
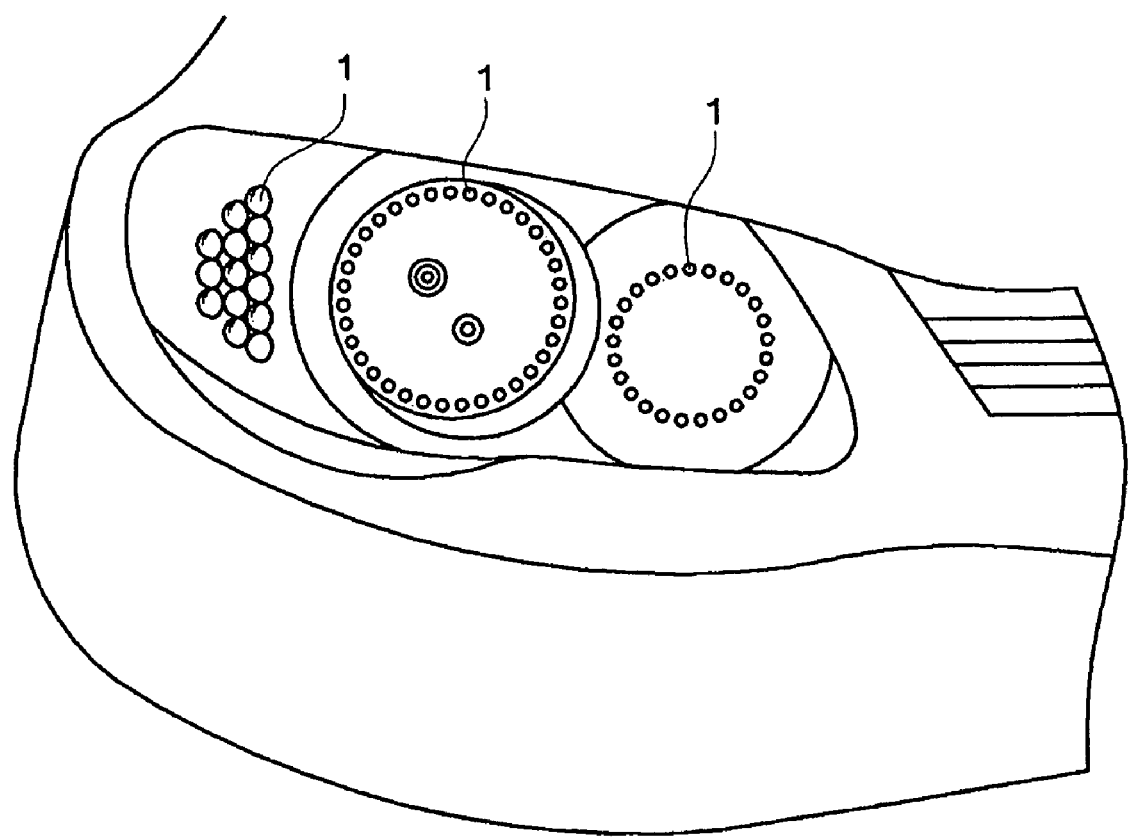
Figure 24:
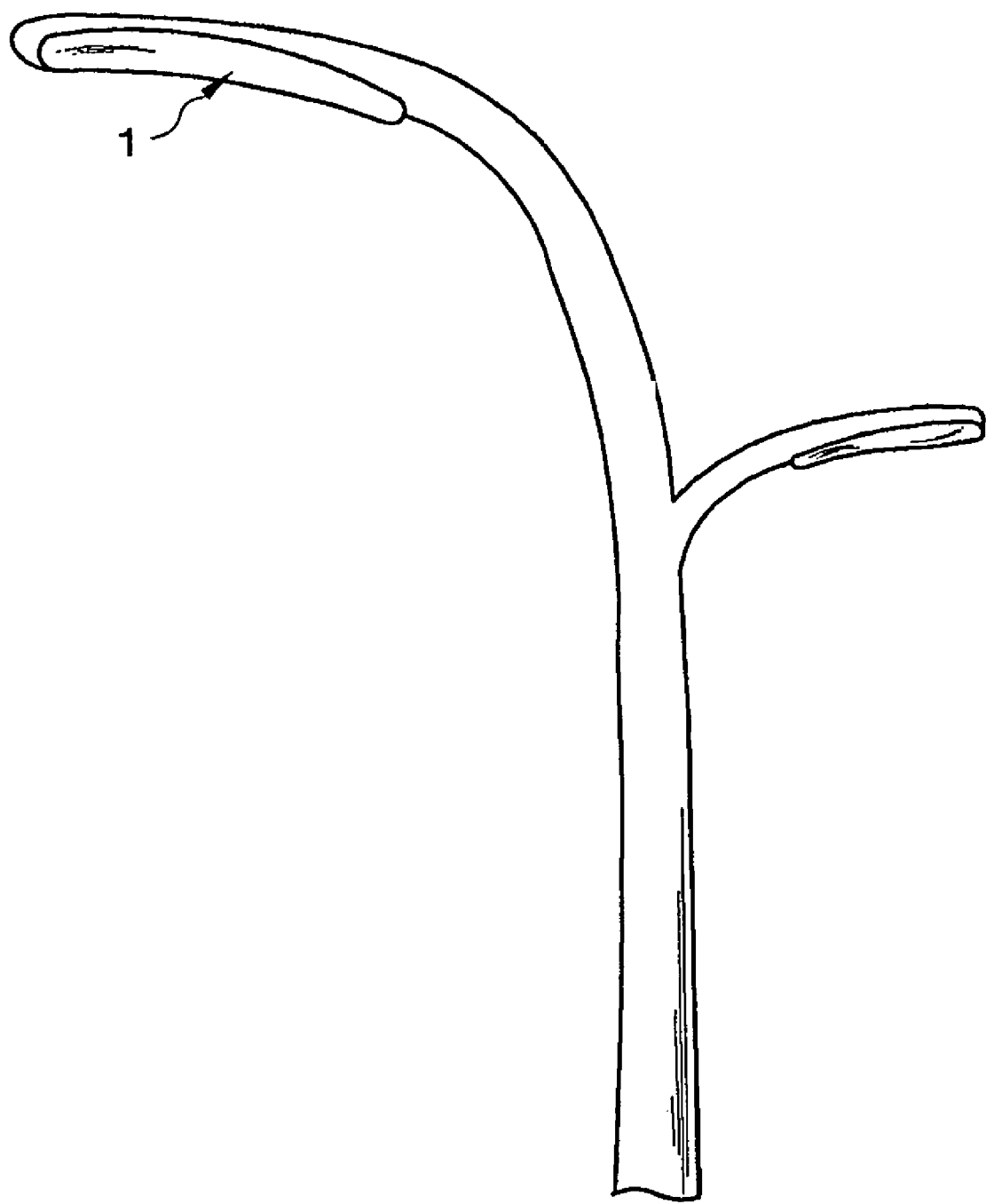
Figure 25:
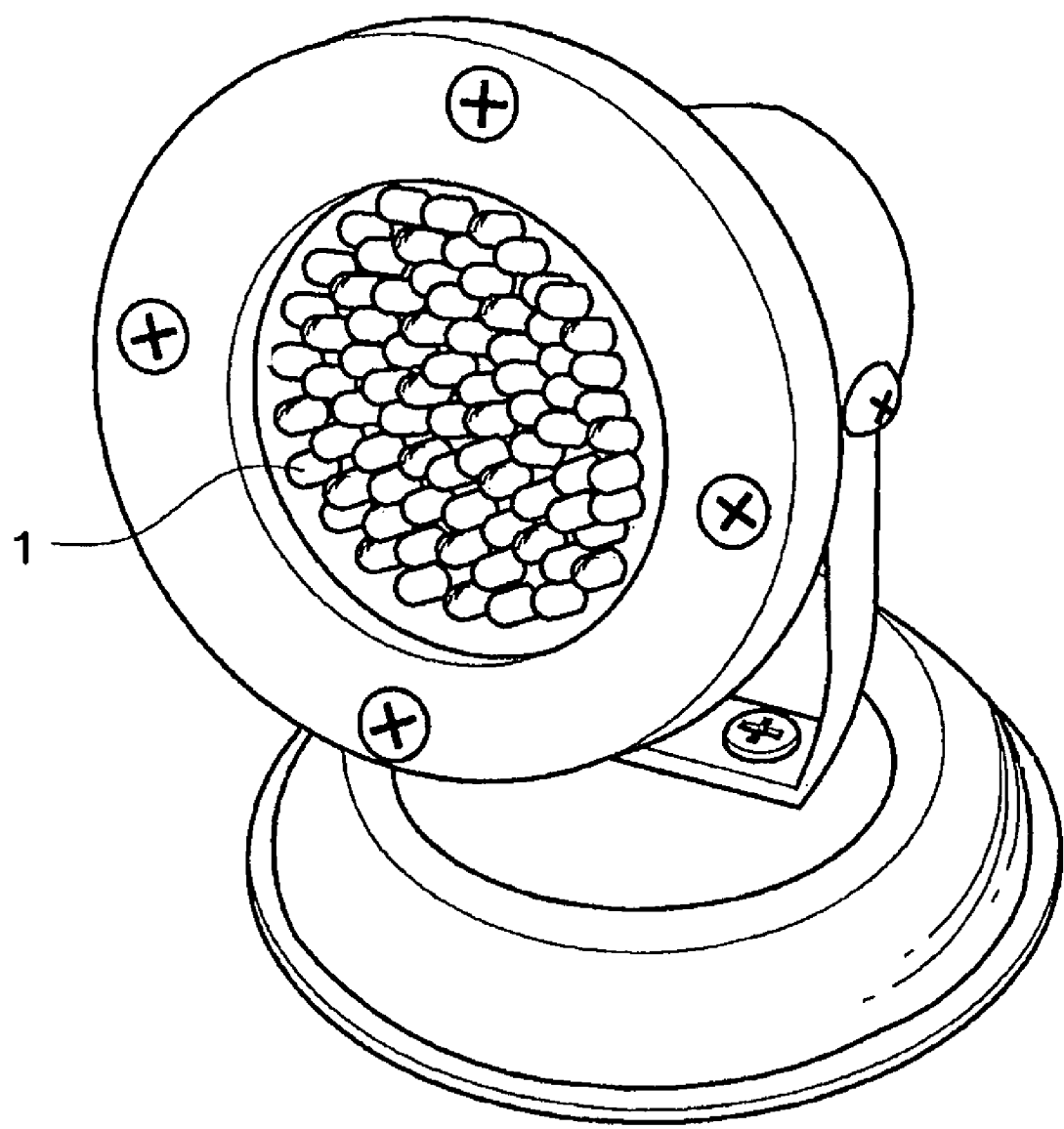

FIGS. 22 through 25 illustrate exemplary devices (end product) according to the previously described light emitting device. FIG. 22 illustrates a projector. FIG. 23 illustrates a headlight of car. FIG. 24 illustrates a streetlight. FIG. 25 illustrates a lamp. The light emitting element 1 used in FIGS. 22 through 25 can be a top view type.

Referring to FIG. 22, light from a light source 410 passes a condensing lens 420, a color filter 430 and a sharping lens 440, and is reflected by a digital micro-mirror device (DMD) 450, passes a projection lens 480, and arrives at a screen 490. Inside the light source 410, the light emitting device described herein is installed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a light emitting element, the method comprising:
    forming a sacrificial layer on at least one first substrate;
    forming a buffer layer on the sacrificial layer;
    bonding the at least one first substrate on a second substrate, wherein the sacrificial layer and the buffer layer are placed between each of the first substrate and the second substrate, and the second substrate is larger than the first substrate;
    after forming the sacrificial layer and the buffer layer, exposing a surface of the buffer layer, wherein exposing the surface of the buffer layer includes removing the at least one first substrate by removing the sacrificial layer with a laser lift off method; and
    sequentially forming a first conductive layer, a light emitting layer, and a second conductive layer on the exposed buffer layer.

2. The method of claim 1, wherein the second substrate includes one side and the other side; the buffer layer, the first conductive later, the light emitting layer, and the second conductive layer are formed on the one side of the second substrate; and further comprising forming a first electrode on the other side of the second substrate, and forming a second electrode on the second conductive layer.

3. The method of claim 2, further comprising separating a chip unit after forming the first electrode and the second electrode.

4. The method of claim 1, wherein the first substrate and the second substrate are bonded by direct bonding.

5. The method of claim 4, wherein:
    the direct bonding includes:
        performing a pre-treatment on one side of the second substrate or on the buffer layer of the first substrate; and
        bonding the second substrate and the at least one first substrate by performing heat treatment so that one side of the second substrate and the buffer layer of the first substrate face each other.

6. The method of claim 5, wherein the pre-treatment includes plasma treatment or wet-treatment.

7. The method of claim 1, wherein the first substrate and the second substrate are bonded by adhesive bonding.

8. The method of claim 7, wherein:
    the adhesive bonding includes:
    placing a conductive intermediate layer between the buffer layer of each of the first substrate and the second substrate; and
    bonding the second substrate and the at least one first substrate by heat treatment.

9. The method of claim 1, wherein:
    forming the sacrificial layer and the buffer layer includes sequentially forming the sacrificial layer and the buffer layer on the at least one first substrate, and.

10. The method of claim 1, wherein the sacrificial layer includes $In_xAl_yGa_{(1-x-y)}N$ ($0 \leq x \leq 1$, $0 \leq y \leq 1$) that is removable by laser.

11. The method of claim 1, further comprising patterning the buffer layer to form a buffer pattern after forming the buffer layer on the at least one first substrate, and
    wherein forming the first conductive layer, the light emitting layer, and the second conductive layer on the exposed buffer layer includes growing a first conductive pattern, a light emitting pattern, and a second conductive pattern according to a shape of the buffer pattern on the buffer pattern.

12. The method of claim 11, wherein the buffer pattern, the first conductive pattern, the light emitting pattern, and the second conductive pattern are cylindrical in shape.

13. The method of claim 1, wherein the first conductive layer is n-type and the second conductive layer is p-type.

14. The method of claim 1, wherein the first substrate comprises sapphire, and the second substrate comprises silicon.

15. A method of fabricating a light emitting device using the method of fabricating a light emitting element of claim 1.

16. The method of claim 1, wherein the buffer layer includes one of $In_xAl_yGa_{(1-x-y)}N$ ($0 \leq x \leq 1$, $0 \leq y \leq 1$) and $Si_xC_yN_{(1-x-y)}$ ($0 \leq x \leq 1$, $0 \leq y \leq 1$).

17. The method of claim 1, wherein:

the sacrificial layer is formed directly on the at least one first substrate;

the buffer layer is formed directly on the sacrificial layer; and bonding the at least one first substrate on the second substrate comprises bonding the buffer layer to the second substrate.

* * * * *